(12) United States Patent
Best

(10) Patent No.: US 6,998,889 B2
(45) Date of Patent: Feb. 14, 2006

(54) CIRCUIT, APPARATUS AND METHOD FOR OBTAINING A LOCK STATE VALUE

(75) Inventor: Scott C. Best, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/638,857

(22) Filed: Aug. 11, 2003

(65) Prior Publication Data

US 2005/0035798 A1    Feb. 17, 2005

(51) Int. Cl.
*H03L 7/06* (2006.01)

(52) U.S. Cl. ..................... 327/157; 327/161

(58) Field of Classification Search ........ 327/147–153, 327/156–161
See application file for complete search history.

(56) References Cited

U.S. PATENT DOCUMENTS

| | | | |
|---|---|---|---|
| 5,381,085 A | | 1/1995 | Fischer |
| 5,475,326 A | * | 12/1995 | Masuda ................ 327/157 |
| 5,663,991 A | | 9/1997 | Kelkar |
| 5,729,151 A | | 3/1998 | Zoerner |
| 5,742,798 A | | 4/1998 | Goldrian |
| 5,757,652 A | | 5/1998 | Blazo |
| 5,886,582 A | * | 3/1999 | Stansell ................ 331/1 A |
| 5,889,435 A | | 3/1999 | Smith |
| 5,942,949 A | * | 8/1999 | Wilson et al. ............ 331/17 |
| 6,002,273 A | * | 12/1999 | Humphreys ............... 327/3 |
| 6,133,769 A | * | 10/2000 | Fontana et al. .......... 327/156 |
| 6,185,510 B1 | | 2/2001 | Inoue |
| 6,404,240 B1 | * | 6/2002 | Hakkal et al. ............ 327/12 |
| 6,549,079 B1 | * | 4/2003 | Crook ..................... 331/17 |
| 6,670,855 B1 | * | 12/2003 | Sumi ...................... 331/11 |
| 6,683,478 B1 | * | 1/2004 | Yoo ........................ 327/12 |
| 6,704,908 B1 | * | 3/2004 | Horan et al. .............. 716/1 |
| 6,757,349 B1 | * | 6/2004 | Katayama et al. ....... 375/376 |

FOREIGN PATENT DOCUMENTS

JP    02000035831 A    2/2000

* cited by examiner

*Primary Examiner*—Timothy P. Callahan
*Assistant Examiner*—Cassandra Cox
(74) *Attorney, Agent, or Firm*—Vierra Magen Marcus Harmon & DeNiro LLP

(57) ABSTRACT

A circuit, apparatus and method provides a lock state value representing an amount of time a phase alignment circuit ("PAC"), such as a PLL or DLL, is tracking or locked to an incoming reference signal for a predetermined period of time. In an embodiment of the present invention, a lock state detection circuit is coupled to a lock loop circuit and includes a phase detection circuit and a counter circuit. The phase detection circuit includes a phase detector and delay elements that are coupled to the PAC phase detector. The phase detector outputs a lock state sample value of the PAC. In an embodiment of the present invention, the PAC is locked when a stream of alternating lock state sample values, logical 1's and 0's, are output from the phase detector. The counter circuit includes a flip-flop, an XOR gate and counter for obtaining a lock state value for a predetermined period of time.

14 Claims, 9 Drawing Sheets

CIRCUIT, APPARATUS AND METHOD FOR OBTAINING A LOCK STATE VALUE

FIELD OF THE INVENTION

The present invention relates to obtaining performance data, and in particular, information regarding the operational performance of a phase-alignment circuit.

BACKGROUND OF INVENTION

A phase-alignment circuit ("PAC"), such as a Phase Lock Loop ("PLL") or a Delay Lock Loop ("DLL"), is an electronic circuit which generates an output signal that has a well-controlled relationship in phase and frequency to an input signal.

Phase-alignment circuits are used in a variety of electronic devices. For example, a PLL may be used for clock synthesis in a multi-purpose processor. In another example, a PAC may be used in point-to-point communication systems, including serial and parallel systems, where one PAC generates a sampling clock at the receiver while another PAC generates a transmit clock at the output driver of the transmitter.

In testing or troubleshooting a phase-alignment circuit such as a PLL, it may be desirable to determine the state of the PLL and/or whether the PLL is locked to an incoming reference signal during a particular period of time. Since a PLL's phase and frequency are typically controlled by precise analog signals, expensive test equipment may be used to obtain the state of the PLL either by extracting this precise analog information directly, or by inferring it via precise measurements of the timing characteristics of the output signal. However, this expensive test equipment adds cost, time and complexity to manufacturing and testing a circuit having or using a PLL. Further, this expensive test equipment may not be readily available during manufacturing, thus increasing the time to manufacture the circuit and/or apparatus.

Therefore, it is desirable to provide a circuit, apparatus and method that obtain the state of a phase-alignment circuit and a quantitative measure of how well it is locked or unlocked during a particular period of time, without the use of expensive test equipment that increases manufacturing costs, manufacturing time and repair time.

DETAILED DESCRIPTION

Embodiments of the present invention allow a circuit, apparatus and method to provide a lock state value representing an amount of time a phase alignment circuit ("PAC") circuit, such as a PLL or DLL, is tracking or locked to an incoming reference signal during a predetermined period of time. In other words, a digital lock state value is generated which represents the quantity of dynamic phase offset (i.e., jitter) between a PAC's reference input and its feedback input during a predetermined period of time. For example, FIG. 1a illustrates jitter between two edges of a reference signal 50 as it is compared to a feedback signal 51: the cycle-to-cycle difference between t1 and t2 is the "jitter" quantity of interest.

Figure 2:
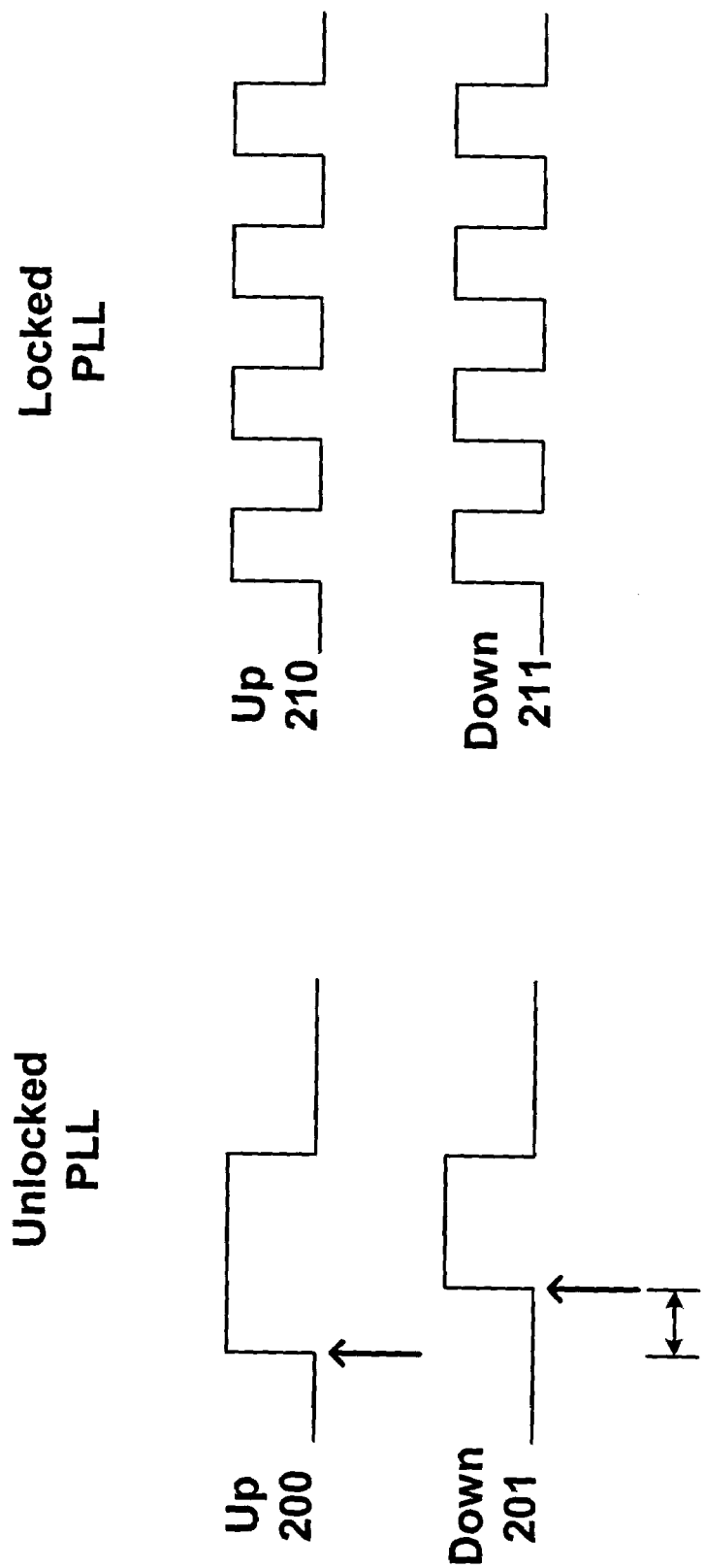
FIG. 2 is a diagram illustrating signals that may be used in accordance with an embodiment of the present invention.

In embodiments of the present invention, a lock state detection circuit is coupled to either a PLL or DLL. In an embodiment of the present invention, a lock state detection circuit includes a novel phase detection circuit and a counter circuit. The phase detection circuit includes a typical phase detector and delay elements coupled to either the input or output of the PAC's phase detector. In a preferred embodiment of the present invention, a novel phase detection circuit is coupled to an output of the PAC's phase detector to sense the phase relationship of the up and down correction pulses the PAC is using to align two inputs. A lock state detection circuit's phase detector and delay elements output lock state sample values, or alternating logical 1's and 0's (i.e. " . . . 101010 . . . "), when the PAC is in a locked state (i.e. when the up and down pulses being sensed are very tightly aligned as seen in FIG. 2).

A counter circuit includes a flip-flop, XOR gate and counter for counting, for a predetermined period of time, the number of sequential non-transitions in the stream of 1's and 0's generated by a lock state detection circuit's phase detector. That is, when an output of an XOR gate is high, an output value of the counter is held; when the XOR output is low, the counter value is incremented. If the value of the counter is periodically read, the change in counter value between the reads indicates the jitter nature or lock state value of the PAC during that predetermined period of time between reads. In an alternate embodiment of the present invention, a second counter and register circuit periodically (e.g. every 64 clock cycles) updates a register value to the lock state value.

Figure 1A:
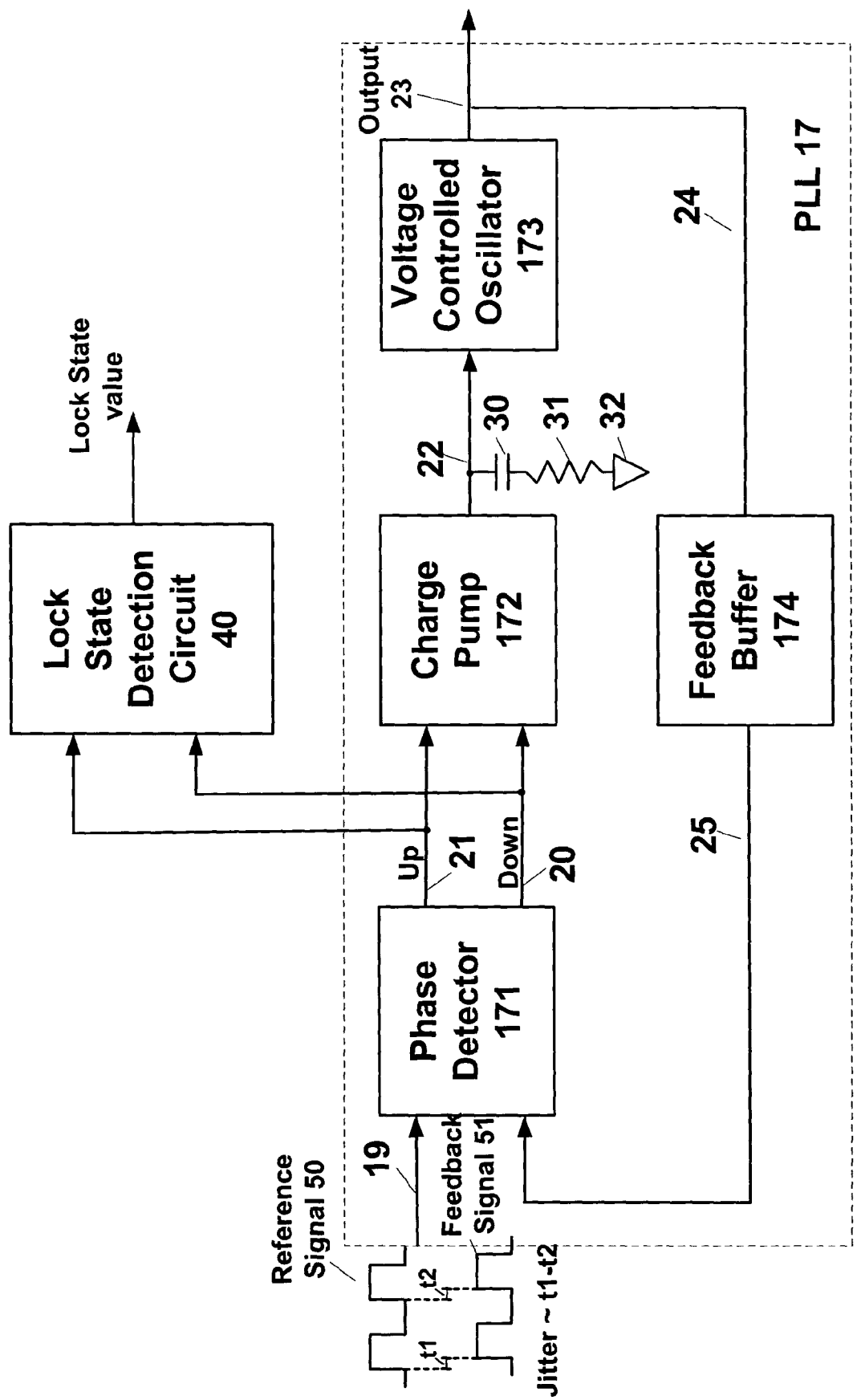
FIG. 1a is a block diagram illustrating a typical PLL and lock state detection circuit in accordance with an embodiment of the present invention.

FIG. 1a illustrates an embodiment of PLL 17 and lock state detection circuit 40. PLL circuit 17 includes a phase detector 171 for comparing two input signals: a reference signal 50 on line 19 and a feedback signal 51 on line 25. In an alternate embodiment of the present invention, reference signal 50 and feedback signal 51 are input to lock state detection circuit 40 instead of up and down signals on lines 21 and 20, respectively.

Figure 1B:
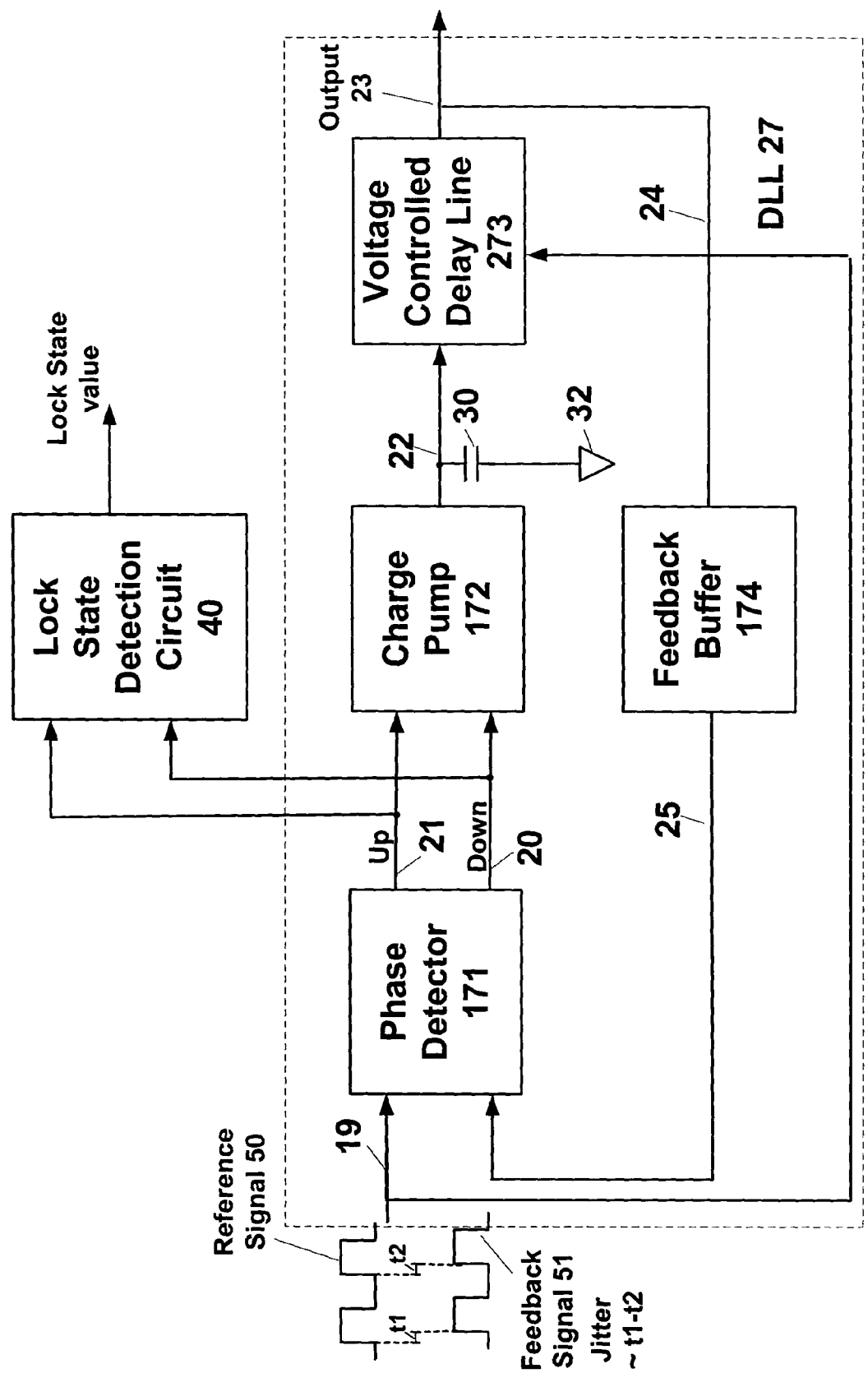
FIG. 1b is a block diagram illustrating a typical DLL and lock state detection circuit in accordance with an embodiment of the present invention.

Similarly, FIG. 1b illustrates an embodiment of the present invention including DLL 27 and lock state detection circuit 40. DLL 27 includes like numbered components which operate as described below with respect to PLL 17, except that DLL 27 uses a voltage controlled delay line ("VCDL") 273 instead of voltage controlled oscillator 173. Since DLLs typically don't require a stabilizing zero, resistor 31 is not required for DLL 27.

Depending upon the phase relationship between the signals on lines 19 and 25, up and down correction pulses are generated from phase detector 171 on lines 21 and 20, respectively. FIG. 2 illustrates exemplary up and down correction pulses from phase detector 171 when PLL 17 is unlocked and locked. When PLL 17 is locked, up and down correction pulses are in phase or very tightly aligned as illustrated by up correction pulse signal 210 and down correction pulse signal 211. When PLL 17 is unlocked, up and down correction pulses are out of phase as illustrated by up pulse correction signal 200 and down correction pulse signal 201.

Up and down signals are input to a charge pump 172 that outputs a current. Capacitor 30 and resistor 31 form a loop filter that is coupled between line 22, the "VCO Control Node", and ground 32. Charge pump 172 and the loop filter generate a control voltage on line 22. Voltage controlled oscillator ("VCO") 173 outputs an oscillating output signal 23 responsive to the control voltage on line 22. The output signal 23 of PLL circuit 17 is also fed back on line 24 to feedback buffer 174 and output on line 25 as a feedback signal 51 to phase detector 171. In an embodiment of the present invention, a divider circuit in feedback buffer 174 may divide the output signal. Phase detector 171 once again compares the feedback signal 51 on line 25 to a reference signal 50 on line 19 and repeats the generation of signals described above. When one or both edges of a reference signal 50 on line 19 are aligned in phase, for at least several reference clock cycles, to the corresponding edge of a feedback signal 51 on line 25, PLL circuit 17 is considered locked. When a reference signal 50 on line 19 is not so aligned to a feedback signal 51 on line 25, PLL circuit 17 is considered unlocked or tracking.

Figure 3:
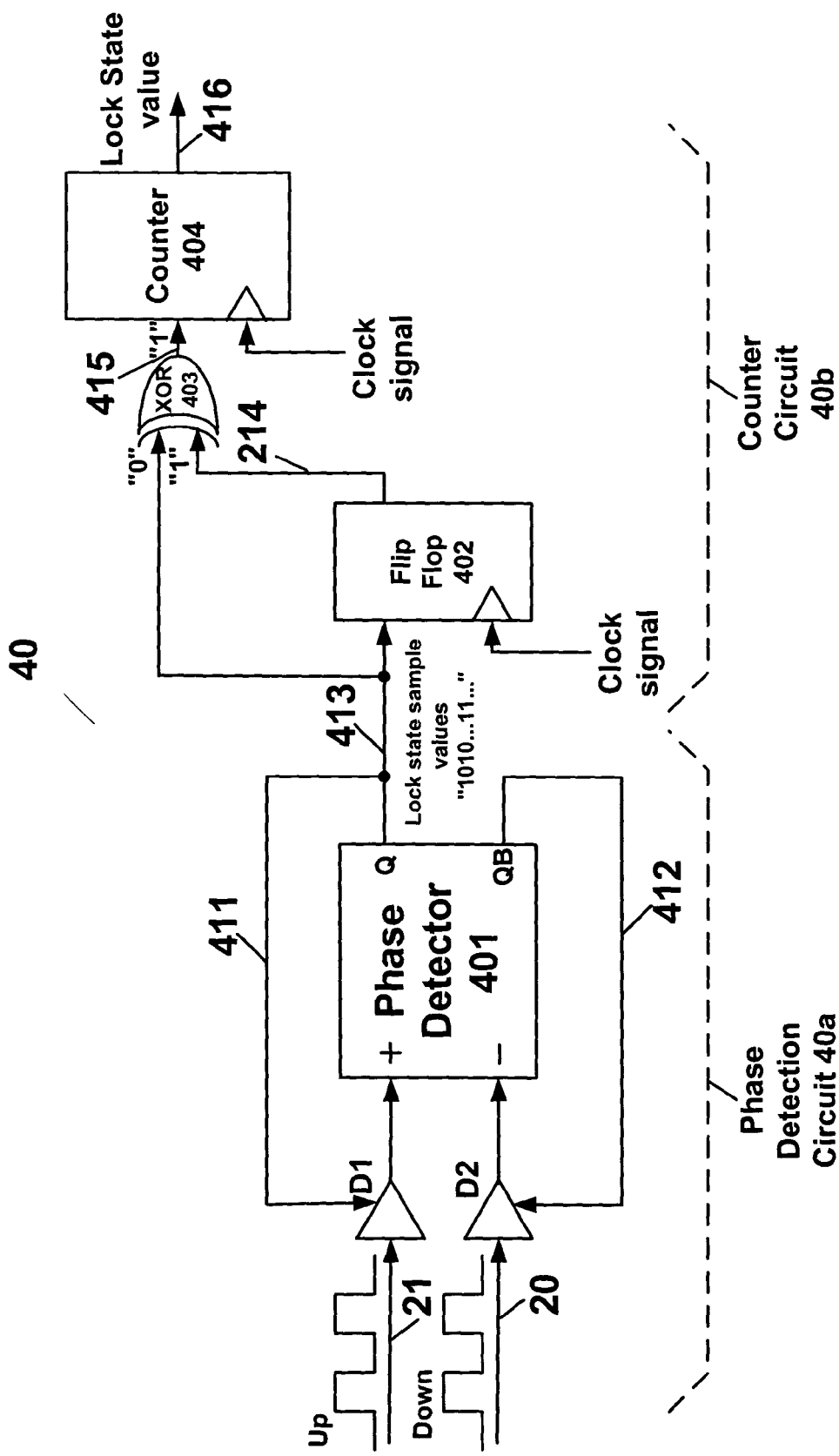
FIG. 3 is a circuit diagram illustrating a lock state circuit shown in FIGS. 1a–b in accordance with an embodiment of the present invention.

FIG. 3 illustrates a lock state detection circuit 40 illustrated in FIGS. 1a–b. In particular, FIG. 3 illustrates phase detection circuit 40a and counter circuit 40b. Phase detection circuit 40a includes a phase detector 401 that operates similarly to phase detector 171 in an embodiment of the present invention. Phase detector 401 includes two outputs, Q and QB, coupled to lines 413 and 412, respectively. Up and down signals are input on lines 21 and 20 from PLL circuit 17. An up signal is input into delay element D1 and a down signal is input into delay element D2. Delay elements D1 and D2 are coupled to phase detector 401 that outputs a lock state sample value on line 413 which is input into flip flop 402. Phase detector 401 outputs are fed back to control the amount of delay used in delay elements D1 and D2 on lines 411 and 412, respectively.

Delay elements D1 and D2 have one of two propagation times. If a delay element control input is a high value, the propagation time is larger than if the delay element control input is a low value. In an embodiment of the present invention, if the up and down signals are tightly aligned in time, the lock state sample value will toggle between opposite values (i.e. . . . 10101 . . . ) so long as the difference between the propagation values of delay elements D1 and D2 overwhelms the inherent offset and uncertainty region of phase detector 401.

Figure 4:
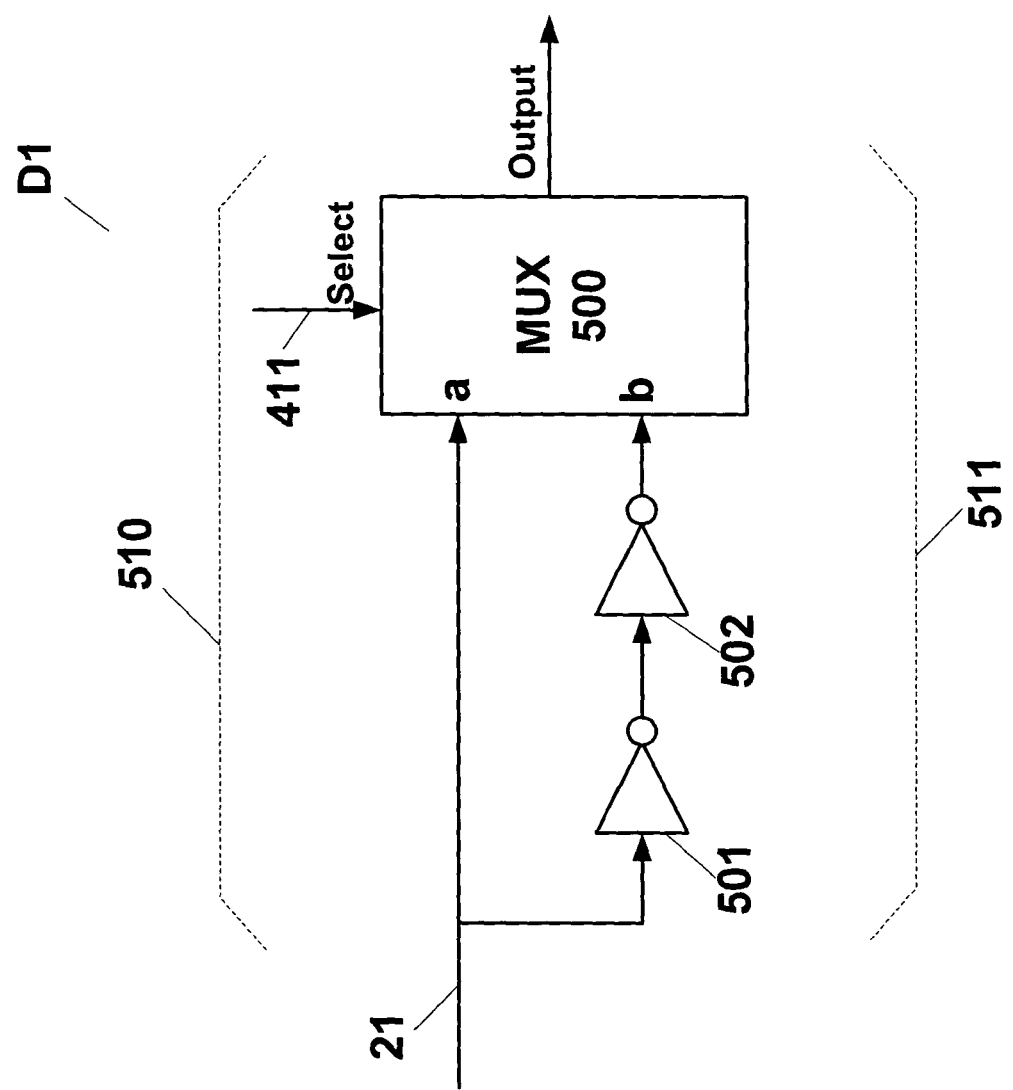
FIG. 4 is a circuit diagram illustrating a delay element shown in FIG. 3 in accordance with an embodiment of the present invention.

FIG. 4 illustrates an exemplary delay element D1 shown in FIG. 3 in an embodiment of the present invention. As described above, delay element D1 includes two propagation paths with different delay times: path 510 having a delay time T1 and path 511 having a delay time T2, where T2>T1. Delay element D1 includes multiplexer 500 and inverters 501 and 502 in an embodiment of the present invention. Line 21 is coupled to a first input of multiplexer 500 and an input of inverter 501. An output of inverter 501 is coupled to an input of inverter 502 that has an output coupled to a second input of multiplexer 500. An output of multiplexer 500 is coupled to an input of phase detector 401. Line 411 is coupled to a select input of multiplexer 500. In an embodiment of the present invention, a lock state sample value is set high (i.e. a logical 1) and on line 411, if an up signal is ahead of a down signal. If a lock state sample value is high and on line 411, path 511 and delay time T2 is provided to an input to delay element D1. Conversely, a lock state sample value is set low and on line 411, if a down signal is ahead of an up signal. If a lock state sample value is low (i.e. a logical 0) and on line 411, path 510 and delay time T1 is provided to an input signal to delay element D1. In an embodiment of the present invention, the difference between T1 and T2 is approximately 25 picoseconds.

In an embodiment of the present invention, delay element D2 has a similar structure and operation. One of ordinary skill in the art would appreciate that other equivalent delay elements provide other delay values in response to a control signal in alternate embodiments of the present invention. Delay elements D1 and D2, along with phase detector 401, function to provide an alternating stream of 1's and 0's, or lock state sample values, when up and down pulses are tightly aligned indicating a locked PLL circuit 17.

FIG. 3 also illustrates a counter circuit 40b including a flip-flop 402, XOR gate 403 and counter 404. A flip-flop 402 input is coupled to a phase detector 401 output by line 413. A first XOR gate 403 input is also coupled to a phase detector 401 by line 413. A second XOR gate 403 input is coupled to a flip-flop 402 output by line 214. An XOR gate 403 output is coupled to counter 404 by line 415. A PLL circuit 17 lock state value is stored in counter 404 and output on line 416. A clock signal is used to time flip-flop 402 and counter 404. In an alternate embodiment of the present invention, multiple clock signals are used to time flip-flop 402 and counter 404. In a preferred embodiment of the present invention, the clock signals used to time flip-flop 402, counter 404 and lock state sample values on line 413 have the same frequency.

Counter circuit 40b counts, for a predetermined number of lock state sample values, the number of sequential non-transitions in the stream of 1's and 0's coming from the phase detection circuit 40a. In an embodiment of the present invention, a 6-bit counter 404 is used to obtain 64 PLL lock state sample values. Counter circuit 40b senses the output of phase detection circuit 40a and uses its XOR functionality to detect how many of those 64 lock state sample values match its sequential neighbor. If all 64 lock state sample values match, PLL 17 is likely unlocked and is still tracking. If no lock state sample values match, PLL 17 is likely locked within the sensitivity of phase detection circuit 40a. If 10 sequential lock state sample values matched in one operating condition (i.e. a nominal amount of power supply voltage was supplied to the PLL), and 20 sequential lock state sample values matched in a second operating condition (i.e. a reduced amount of power supply voltage was supplied to the PLL), the second operating condition could be said to have a higher jitter condition or higher lock state value for PLL 17. One of ordinary skill in the art would appreciate that other counters may be used in place of Counter circuit 40b to count the number of sequential non-transitions in a series of bits, in alternate embodiments of the present invention.

In an alternate embodiment of the present invention, counter 404 is replaced with a plurality of registers or memory for providing a snapshot of a plurality of lock state values of PLL 17 during a predetermined period of time.

Figure 5:
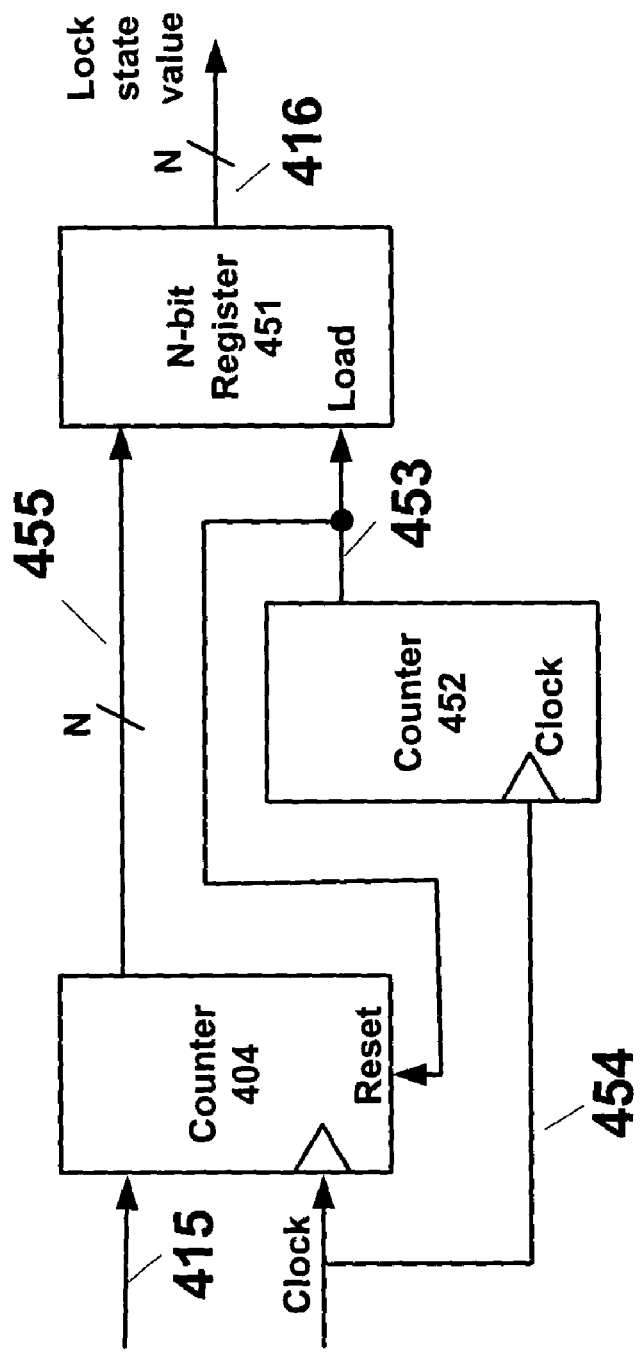
FIG. 5 is a circuit diagram in accordance with an embodiment of the present invention.

In still a further embodiment of the present invention, counter 404 is coupled to a counter 452 and an N-bit register 451 as illustrated in FIG. 5. Counter 404 outputs a lock state value on line 455 to inputs of register 451. A counter 404 input is coupled to a phase detector 401 output by line 415. Counter 452 is an 8-bit counter initialized to zero that generates a "reset" and "load" signal on line 453 to counter 404 and N-bit register 451 every 64 clock cycles in an embodiment of the present invention. A clock signal on line 454 is used to time counter 404 and 8-bit counter 452. Thus, N-bit register 451 is updated and outputs a lock state value every 64-clock cycles in an embodiment of the present invention.

In an alternate embodiment of the present invention, PLL 17 and DLL 27 shown in FIGS. 1a–b do not include feedback buffer 174. In an alternate embodiment of the present invention, feedback buffer 174 is replaced with a frequency divider circuit. In still a further embodiment of the present invention, feedback buffer 174 is replaced with a clock path matching circuit.

Figure 6:
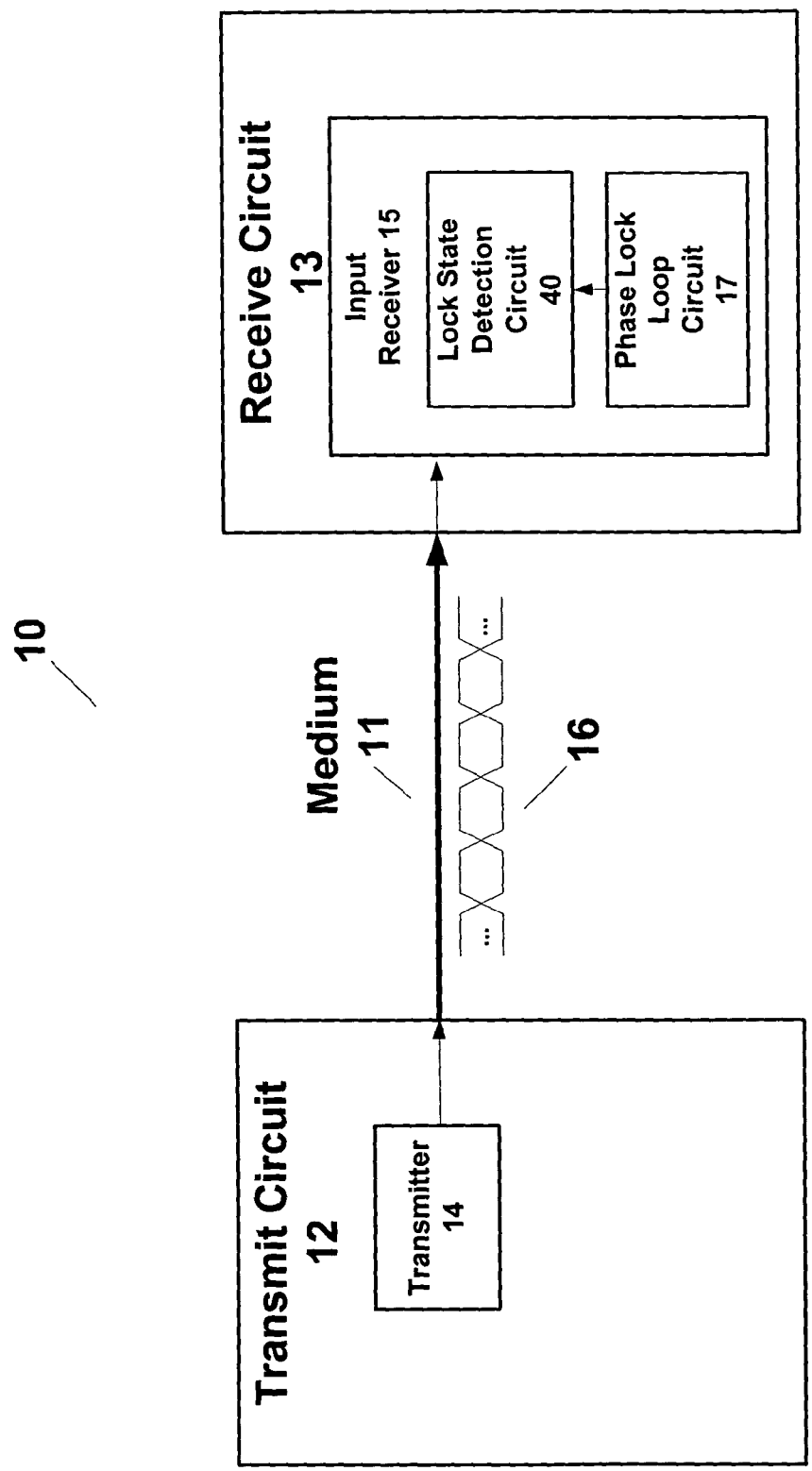
FIG. 6 is a block diagram illustrating an apparatus in accordance with an embodiment of the present invention.

FIG. 6 illustrates a communication system 10 having a lock state detection circuit 40 according to an embodiment of the present invention. In an embodiment of the present invention, communication system 10 includes a transmit circuit 12 and a receive circuit 13 coupled by medium 11. In an embodiment of the present invention, transmitter 14 generates serial data 16 and transmits such serial data 16 on medium 11 to receive circuit 13. In embodiments of the present invention, receive circuit 13 and/or transmit circuit 12 include a lock state detection circuit 40 as illustrated in FIGS. 1a–5. In an embodiment of the present invention, serial data 16 is input on line 19, as shown in FIGS. 1a–b, from medium 11. In an embodiment of the present invention, receive circuit 13, and in particular phase detector 171, includes a transition detector circuit.

In an embodiment of the present invention, medium 11 is a wire or set of wires for transporting signals, such as waveforms. In an embodiment of the present invention, medium 11 is a bidirectional data bus that may carry data information, control information or both. In an alternate embodiment of the present invention, medium 11 is a unidirectional bus.

Receive circuit 13 includes an input receiver 15 for deserializing serial data 16 in an embodiment of the present invention. Input receiver 15 includes a PLL circuit 17 and lock state detection circuit 40 in an embodiment of the present invention. In an alternate embodiment of the present invention, transmit circuit 12 includes a PLL circuit 17 and lock state detection circuit 40.

Figure 7:
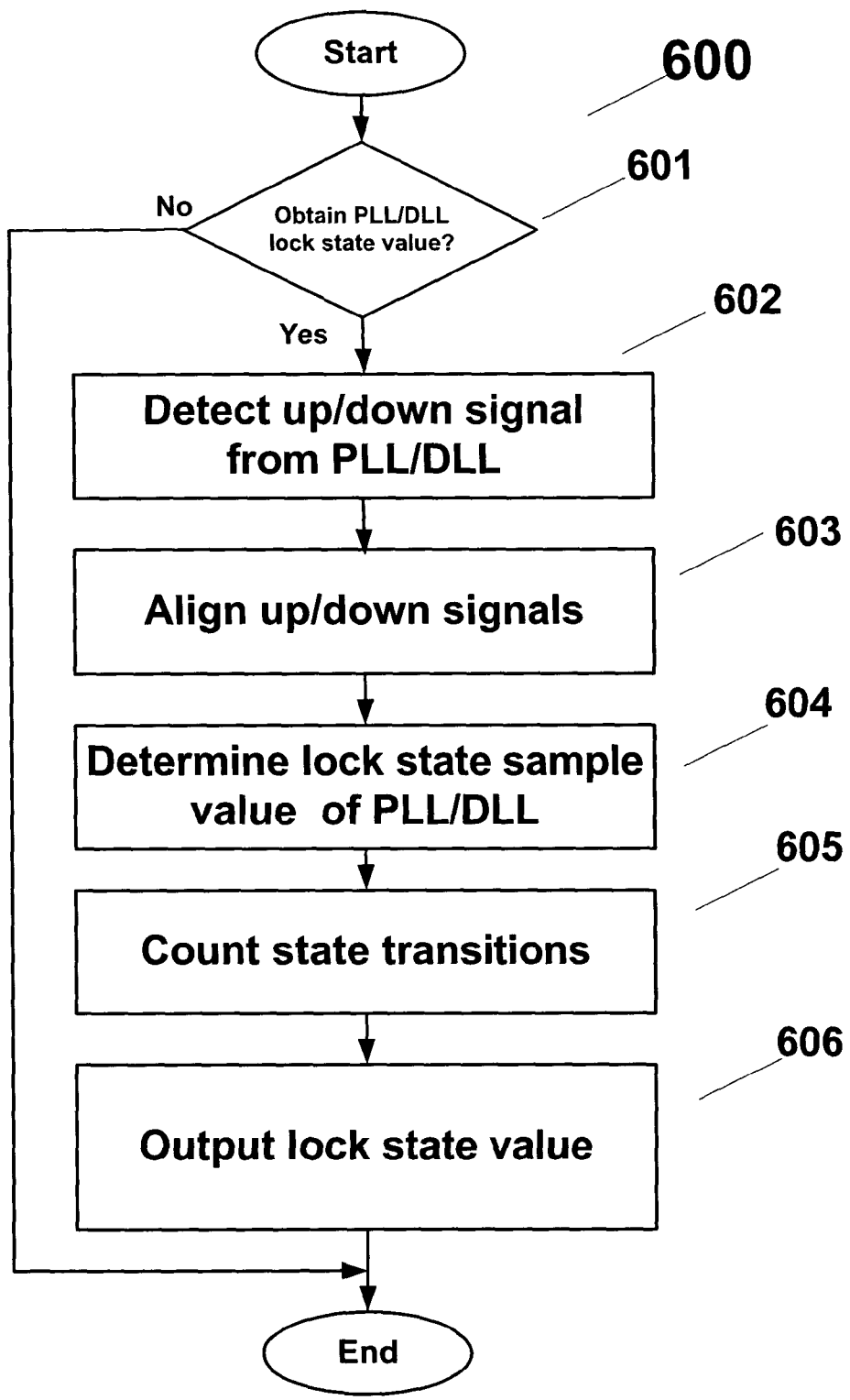
FIG. 7 is a flow chart of a method in accordance with an embodiment of the present invention.

FIG. 7 illustrates a method 600 according to an embodiment of the present invention. In alternate embodiments of the present invention, the steps illustrated in FIG. 7 are carried out by hardware, software or a combination thereof. In alternate embodiments, the steps illustrated in FIG. 7 are carried out by the components illustrated in FIGS. 1a–b, 3, 4 and 5. As one of ordinary skill in the art would appreciate, other steps that are not shown may be included in various embodiments of the present invention.

Method 600 begins at step 601 where a determination is made whether to obtain a PAC lock state value. In an embodiment of the present invention, step 601 is performed during a self-test of a circuit or apparatus before or during operation. For example, a PAC lock state value may be obtained in apparatus 10 before operation and/or periodically. In an embodiment of the present invention, a lock state value is obtained and compared to a predetermined lock state threshold value. If the lock state value does not exceed the predetermined threshold value, apparatus 10 may be disabled and/or an error message warning of this occurrence is provided to a user or operator. In an alternate embodiment of the present invention, step 601 is performed during the manufacturing of a circuit or semiconductor. For example, a PLL lock state value is obtained as various other circuit components are powered up or brought on line in order to debug or evaluate circuit performance and/or noise injection.

If a PAC lock state value is not currently needed, method 600 ends.

After a determination is made to obtain a PAC lock state value in step 601, an up and down signal is obtained in step 602. In an embodiment of the present invention, an up and down signal is obtained from a phase detector in a PLL, such as phase detector 171 in PLL 17 shown in FIG. 1a. In an alternative embodiment of the present invention, serial data 16 (instead of a reference signal clock) is used as one of the inputs to phase detector 171.

During lock, PLL 17 or DLL 27 will work to align reference signal 50 and feedback signal 51 in step 603. In an embodiment of the present invention, the PAC's up and down signals will become substantially aligned when PLL 17 or DLL 27 is locked.

A lock state sample value for a particular time is determined in step 604. A current lock state sample value of PLL 17 is output by a phase detector, such as phase detector 401 illustrated in FIG. 3 in an embodiment of the present invention.

Transitions of lock state sample values are counted in step 605. In an embodiment of the present invention, flipflop 402, XOR gate 403 and counter 404 count the number of transitions between a logic 1 and 0 indicating a locked PAC for a predetermined number of lock state samples.

A lock state value then may be output from counter 404 indicating how well a PAC is tracking in step 606.

Method 600 then ends.

Figure 8A:
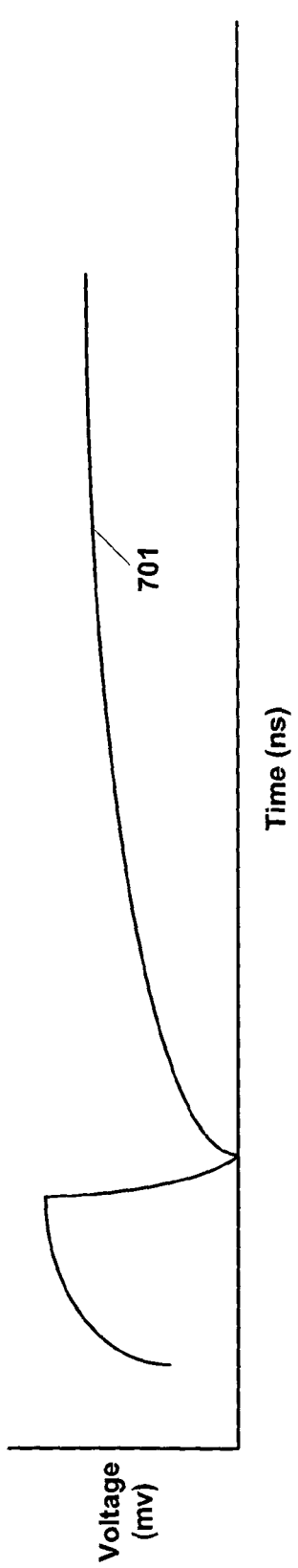
FIGS. 8a and 8b illustrate circuit waveforms, during and after PLL lock, associated with a PLL control signal in accordance with an embodiment of the present invention.
Figure 8B:
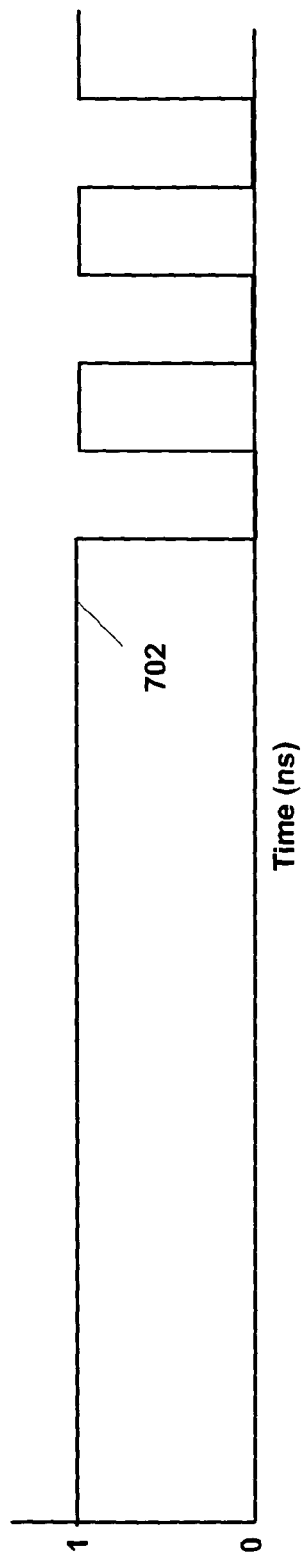

FIGS. 8a and 8b illustrate the voltage of the VCO Control Node of PLL circuit 17 and the respective lock state values for a period of time. FIG. 8a illustrates curve 701 representing voltage values at line 22 in PLL circuit 17 shown in FIG. 1a. FIG. 8b illustrates a lock state sample value curve 702 representing lock state sample values, at line 413 shown in FIG. 3, while PLL 17 tracks and then locks to a reference signal. As can be seen, lock state sample values begin with a steady stream of 1 values, but then start alternating between 1's and 0's when PLL 17 locks to a reference signal.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit comprising:
   a first circuit to provide an adjust signal in response to a comparison of a reference signal and a feedback signal; and a detection circuit, coupled to the first circuit, to generate a value that represents an amount of time, wherein the reference signal and the feedback signal are locked during a predetermined period of time, in response to the adjust signal, wherein the adjust signal includes an up signal and a down signal has been inserted, wherein the detection circuit includes, a phase detector to generate a value that represents whether the first circuit is in a lock state in response to the adjust signal, a first delay element, coupled to a first phase detector input, to delay the up signal; and, a second delay element, coupled to a second phase detector input, to delay the down signal.

2. A circuit comprising:

a first circuit to provide an adjust signal, including an up signal and down signal, in response to a comparison of a reference signal and a feedback signal; and a detection circuit, coupled to the first circuit, to generate a lock state value, that represents a dynamic phase offset between the reference signal and the feedback signal for a predetermined period of time, in response to the adjust signal, wherein the detection circuit includes, a phase detector to generate a lock state sample value in response to the adjust signal, a first delay element, coupled to a first phase detector input, to delay the up signal, and a second delay element, coupled to a second phase detector input, to delay the down signal, wherein the first delay element includes a first multiplexer and a first inverter coupled to a first input of the multiplexer.

3. The circuit of claim 2, wherein the second delay element includes a second multiplexer and a second inverter coupled to a first input of the multiplexer.

4. A circuit comprising:

a first circuit to provide an adjust signal, including an up signal and down signal, in response to a comparison of a reference signal and a feedback signal; and a detection circuit, coupled to the first circuit, to generate a lock state value that represents a dynamic phase offset between the reference signal and the feedback signal for a predetermined period of time, in response to the adjust signal, wherein the detection circuit includes, a phase detector to generate a lock state sample value in response to the adjust signal, a first counter, coupled to the phase detector, to obtain the lock state value, in response to the lock state sample value, a flip-flop, coupled to the phase detector, to store the lock state sample value; and, an XOR gate, coupled to the flip-flop and the counter, to provide a count value in response to the lock state sample value.

5. The circuit of claim 4, further comprising:

a second counter, coupled to the first counter, to provide the lock state value for the predetermined period of time.

6. A circuit comprising:

a phase alignment circuit to provide an up signal and a down signal in response to a comparison of a reference signal and a feedback signal;

a phase detector, coupled to the phase alignment circuit, to generate a lock state sample value in response to the up signal and the down signal;

a counter, coupled to the phase detector, to store a lock state value that represents a dynamic phase offset between the reference signal and the feedback signal, in response to the lock state sample value;

a first delay element, coupled to a first phase detector input, to delay the up signal; and, a second delay element, coupled to a second phase detector input, to delay the down signal;

a flip-flop, coupled to the phase detector, to store the lock state sample value; and, an XOR gate, coupled to the flip-flop and the counter, to provide a count value in response to the lock state sample value.

7. A circuit comprising:

a first phase detector to output an adjust signal, including an up signal and a down signal, in response to a comparison of a reference signal and a feedback signal;

a charge pump, coupled to the first phase detector, to generate a charge signal in response to the adjust signal;

a voltage controlled oscillator, coupled to the charge pump, to output the feedback signal in response to the charge signal; and, a second phase detector, coupled to the first phase detector, to generate a lock state sample value, in response to the adjust signal;

a counter, coupled to the second phase detector, to obtain a lock state value that represents a dynamic phase offset between the reference signal and the feedback signal during a predetermined period of time, in response to the lock state sample value;

a first delay element, coupled to a first phase detector input of the second phase detector, to delay the up signal;

a second delay element, coupled to a second phase detector input of the second phase detector, to delay the down signal;

a flip-flop, coupled to the second phase detector, to store the lock state sample value; and, an XOR gate, coupled to the flip-flop and the counter, to provide a count value in response to the lock state sample value.

8. The circuit of claim 7, wherein the first delay element includes a first multiplexer and a first inverter coupled to a first input of the first multiplexer.

9. The circuit of claim 8, wherein the second delay element includes a second multiplexer and a second inverter coupled to a first input of the second multiplexer.

10. A method comprising:

providing an adjustment signal from a circuit in response to a comparison of a reference signal and a feedback signal; and providing a value that represents an amount of time, wherein the reference signal and the feedback signal are aligned during a predetermined period of time, wherein providing the value includes, providing a plurality of values that represent whether the reference signal and feedback signal are in a lock state, wherein the providing the plurality of values includes:

counting a transition between a first value and a second value in the plurality of values.

11. A method comprising:

providing an adjustment signal from a circuit in response to a comparison of a reference signal and a feedback signal;

delaying the adjustment signal, and providing a value that represents an amount of time, wherein the reference signal and the feedback signal are aligned during a predetermined period of time.

12. An apparatus comprising:

a transmit circuit to generate serial data;

a medium, coupled to the transmit circuit;

a receive circuit, coupled to the medium, to receive the serial data, wherein the receive circuit includes:

a first circuit to provide an up signal and a down signal in response to a comparison of a first signal and a second signal;

a detector, coupled to the first circuit, to generate a lock state sample value in response to the up signal and the down signal;

a counter, coupled to the detector, to obtain a lock state value that represents a dynamic phase offset between the first signal and the second signal for a predetermined period of time, in response to the lock state sample value;

a first delay element, coupled to a detector input of the detector, to delay the up signal;

a second delay element, coupled to a second detector input of the detector, to delay the down signal;

a flip-flop, coupled to the detector, to store the lock state sample value; and, an XOR gate, coupled to the flip-flop and the counter, to provide a count value in response to the lock state sample value.

13. The apparatus of claim 12, wherein the first delay element includes a first multiplexer and a first inverter coupled to a first input of the first multiplexer.

14. The apparatus of claim 12, wherein the second delay element includes a second multiplexer and a second inverter coupled to a first input of the second multiplexer.

* * * * *

UNITED STATES PATENT AND TRADEMARK OFFICE
CERTIFICATE OF CORRECTION

PATENT NO. : 6,998,889 B2 Page 1 of 1
APPLICATION NO. : 10/638857
DATED : February 14, 2006
INVENTOR(S) : Best It is certified that error appears in the above-identified patent and that said Letters Patent is hereby corrected as shown below:

Col. 7, line 6*: after "signal" and before "wherein" delete "has been inserted".

Signed and Sealed this

Twenty-sixth Day of December, 2006

JON W. DUDAS
*Director of the United States Patent and Trademark Office*